United States Patent
Tsai et al.

[11] Patent Number: 6,117,780
[45] Date of Patent: Sep. 12, 2000

[54] CHEMICAL MECHANICAL POLISHING METHOD WITH IN-LINE THICKNESS DETECTION

[75] Inventors: Kuei-Chang Tsai, Taichung; Chin-Hsiang Chang, Keelung; Li-Chun Hsien, Kaohsiung; Yun-Liang Ouyang, Taipei, all of Taiwan

[73] Assignee: Mosel Vitelic Inc., Hsinchu, Taiwan

[21] Appl. No.: 09/296,520

[22] Filed: Apr. 22, 1999

[51] Int. Cl.[7] .................................................. H01L 21/00
[52] U.S. Cl. ............................ 438/692; 216/85; 216/88; 438/8
[58] Field of Search ................................ 438/8, 16, 691, 438/692, 693, 745, 747; 216/84, 85, 88, 89

[56] References Cited

U.S. PATENT DOCUMENTS

| | | | |
|---|---|---|---|
| 5,695,601 | 12/1997 | Kodera et al. | 216/88 X |
| 6,000,996 | 12/1999 | Fujiwara | 216/88 X |

*Primary Examiner*—William Powell
*Attorney, Agent, or Firm*—Harold L. Novick; Nath & Associates

[57] ABSTRACT

The present invention discloses a chemical mechanical polishing method with in-line thickness detection. First, the semiconductor wafer is loaded into CMP equipment and is putted on a loading table for the preparation of a CMP process. The CMP process is performed on the wafer for polishing. The CMP process is interrupted and the thickness of a polished thin film layer is detected by using an in-line thickness measurement technique. The thickness is determined whether or not being accepted by a specification of the CMP process. As the thickness is accepted by the specification, the wafer is cleaned, dried and moved out from the CMP equipment. Alternatively, the thickness is not accepted by the specification, it must be determined whether or not the thickness is less than the low limit of the specification. As the thickness is smaller than the low limit, the wafer is cleaned, dried after it is moved out from the CMP equipment. Alternatively, the thickness is larger than the low limit and not accepted by the specification, the CMP process of the wafer must be started again.

16 Claims, 3 Drawing Sheets

CHEMICAL MECHANICAL POLISHING METHOD WITH IN-LINE THICKNESS DETECTION

FIELD OF THE INVENTION

The present invention relates to a chemical mechanical polishing method, and more specifically, to a chemical mechanical polishing method with in-line thickness detection for thin films on wafers.

BACKGROUND OF THE INVENTION

Integrated circuits, which are fabricated in recent years, are ultra-scale-large integrated circuits. The integration of integrated circuits continuously increases and the line-width of integrated circuited decreases at the same time. In the fabrication of ULSI circuits, a planarization process for a thin film on a wafer is a critical technique. The planarization process, which is adopted in a conventional process of integrated circuits, uses spin-on glass as a dielectric layer to refill voids on wafers. However, this conventional planarization process is a local planarization process for dielectric layer in integrated circuits and the process can not be applied on other materials used in integrated circuits.

A planarization process, which is called as chemical mechanical polishing technique, provides global planarization ability for dielectric material. This kind of planarization process has become a trend of a planarization process for ULSI circuits. A chemical mechanical polishing process is performed in chemical mechanical polishing (CMP) equipment to polish surfaces of semiconductor's wafers. During wafers are polished on a pad in the CMP equipment, slurry is scattered over the pad, the polished surface of the wafer contacts with the pad and the wafers are rotated for polishing the polished surface. According to the design requirement of integrated circuits, a thin film layer, which is polished, on a wafer after the planarization process must have a thickness being accepted by a specification to make sure that the film has an adequate thickness.

Because of the design of the conventional chemical mechanical polishing equipment, wafers have to be moved out the CMP equipment, then cleaned and dried before the thickness measurement of the polished thin film layer. The conventional thickness measurement is applied on wafers without any water or solution thereon. The limitation of the thickness measurement technique has influence on the flow chart of the chemical mechanical polishing process of wafers. Thus, a special flow chart is adopted for controlling the movements of wafers in the chemical mechanical polishing equipment. A flow chart of a chemical mechanical polishing process within conventional chemical mechanical polishing equipment is explained as below.

Referring to FIG. 1, a flow chart of a semiconductor wafer polished in a chemical mechanical polishing (CMP) equipment is demonstrated. First, in Step 200, a semiconductor wafer is loaded into a CMP equipment. Step 200 is followed by Step 210; the semiconductor wafer is put on a loading table for a preliminary position before a CMP process. In Step 220, CMP process is performed on the semiconductor wafer that is fixed to a polishing head. The wafer is put on a polishing head for globally polishing the main surface of the semiconductor wafer. After the semiconductor wafer is polished, Step 230 is performed to transfer the wafer to an unloading table before the wafer is removed from the CMP equipment. Step 240 is to transfer the semiconductor wafer a scrubbing apparatus for cleaning slurries on the wafer. In Step 250, the semiconductor wafer is transferred into an unload cassette and is unloaded from the CMP equipment. As Step 250 is completed, the CMP process of the wafer is finished. Following Step 250, Step 255 is performed to move the wafer out from the CMP equipment. In Step 260, the semiconductor wafer is cleaned and dried to remove contamination and solvent on the surface of the wafer. In Step 270, the thickness of the polished thin film layer is measured by using a thickness measurement apparatus. In Step 280, it is determined whether or not the thickness is accepted by a specification of the CMP process. As the thickness is not accepted by the specification, Step 282 is then performed. As the thickness is accepted by the specification, Step 281 is performed to remove the wafer out the CMP equipment. In Step 282, while the thickness of the polished thin film layer is less than the low limit of the specification, then Step 290 is performed for the deposition of the polished thin film layer. In Step 282, as the thickness of the polished thin film layer is not less than the low limit of the specification, Step 200 is performed again for keeping on the CMP process.

The flow chart, as mentioned in the above description, carries out in conventional CMP equipment. In the above flow chart, it is noted that the semiconductor wafer moves out the CMP equipment in a conventional CMP process before the cleaning and drying process of the wafer. The thickness measurement of the polished thin film layer executes after the slurry on the wafer is removed. The design of the flow chart is based on the limitation of the thickness measuring technique. The thickness measurement of the semiconductor wafer has to be executed outside the CMP equipment. As the thickness of the polished thin film layer is not accepted by the specification of the CMP process, the CMP process must keep on the semiconductor wafer. Alternatively, the polished thin film layer is deposited and the CMP process is then performed on the wafer. Furthermore, before the second CMP process of the semiconductor wafer is used, the wafer must be cleaned and dried, the flow chart becomes very complicated. If a new CMP process is performed on the semiconductor wafer, the flow chart must start from the beginning again. It takes too much time for the flow of the wafer and the cost of the CMP process is increased at the same time.

In a conventional CMP process, an end-point detector is applied for detecting the thickness of a polished thin film layer. The technique, using an end-point detector, measures the thickness of the polished thin film layer on a small area (normally, on peripheral area) of a wafer during a CMP process. Besides, the wafer is polished in a rotary way. The peripheral surface of the wafer has a different rotating rate from that of the central surface of the wafer. Similarly, there is a different polishing rate between the peripheral region and central region. The prior end-point detector just detects the some peripheral regions around the wafer and not the entire region over the wafer. According to this kind of measuring technique, measuring errors easily occurs and the thickness of the polished thin film layer can not be accurately determined.

Therefore, what is needed is a CMP process with an in-line thickness measurement. A thickness measurement is carried out in CMP equipment without removing wafers out the CMP equipment. The wafers do not be cleaned and dried until the CMP process of the wafers is finished. The polished thin film layer is detected in the CMP equipment to determine whether or not the CMP process is continued.

SUMMARY OF THE INVENTION

The present invention discloses a chemical mechanical polishing method with an in-line thickness measurement of a wafer in chemical mechanical polishing equipment. First, the wafer is loaded into the chemical mechanical polishing equipment. A chemical mechanical polishing process is performed on the wafers for polishing a film on the wafer. An in-line thickness measurement of the film is performed on the wafer, as the chemical mechanical polishing process is interrupted. The thickness is determined whether or not being accepted by a specification. As the thickness is accepted by the specification, the chemical mechanical polishing process is stopped, the wafer is moved out from the CMP equipment and then cleaned. The data measured by the in-line thickness measurement detectors is transferred into a computer and the computer will vary the polishing time of next-batch wafers in the CMP equipment.

A chemical mechanical polishing apparatus for in-line measuring a thickness of a film on a wafer, comprising: wafer loading cassettes connecting to the chemical mechanical polishing apparatus for loading wafer into the chemical mechanical polishing apparatus; a robot arm to catch the wafers; a wafer aligner, the robot arm catches the wafers from the loading cassettes and puts the wafers on the wafer aligner to adjust orientation of the wafers; an index table positioned in the chemical mechanical polishing apparatus, the wafer aligner moves the wafers to the index table before a chemical mechanical polishing process is performed on the wafer; a polishing pad positioned in the chemical mechanical polishing apparatus, the wafers are polished on the polishing pad; an in-line thickness measurement apparatus positioned beyond the polishing pad, the wafer is detected by using the in-line thickness measurement apparatus to measure a thickness of a film on the wafers during the chemical mechanical polishing process; a scrubber for scrubbing the wafer after the chemical mechanical polishing process; wafer unload cassettes connecting to the chemical mechanical polishing apparatus for unloading the wafers from the chemical-mechanical apparatus after the wafers have been cleaned and dried.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a chemical mechanical polishing method with an in-line thickness measurement of a wafer in a chemical mechanical polishing equipment. First, the wafer is loaded into the chemical mechanical polishing equipment. A chemical mechanical polishing process is performed on the wafers for polishing a film on the wafer. An in-line thickness measurement of the film is performed on the wafer, as the chemical mechanical polishing process is interrupted. The thickness is determined whether or not being accepted by a specification. As the thickness is accepted by the specification, the chemical mechanical polishing process is stopped and the wafer is moved out the CMP equipment, then cleaned and dried.

A chemical mechanical polishing apparatus for in-line measuring a thickness of a film on a wafer, comprising: wafer loading cassettes connecting to the chemical mechanical polishing apparatus for loading wafer into the chemical mechanical polishing apparatus; a robot arm to catch the wafers; a wafer aligner, the robot arm catches the wafers from the loading cassettes and puts the wafers on the wafer aligner to adjust orientation of the wafers; an index table positioned in the chemical mechanical polishing apparatus, the wafer aligner moves the wafers to the index table before a chemical mechanical polishing process is performed on the wafer; a polishing pad positioned in the chemical mechanical polishing apparatus, the wafers are polished on the polishing pad; an in-line thickness measurement apparatus positioned beyond the polishing pad, the wafer is detected by using the in-line thickness measurement apparatus to measure a thickness of a film on the wafers during the chemical mechanical polishing process; a scrubber for scrubbing the wafer after the chemical mechanical polishing process; wafer unload cassettes connecting to the chemical mechanical polishing apparatus for unloading the wafers from the chemical-mechanical apparatus after the wafers have been cleaned and dried.

Figure 1:
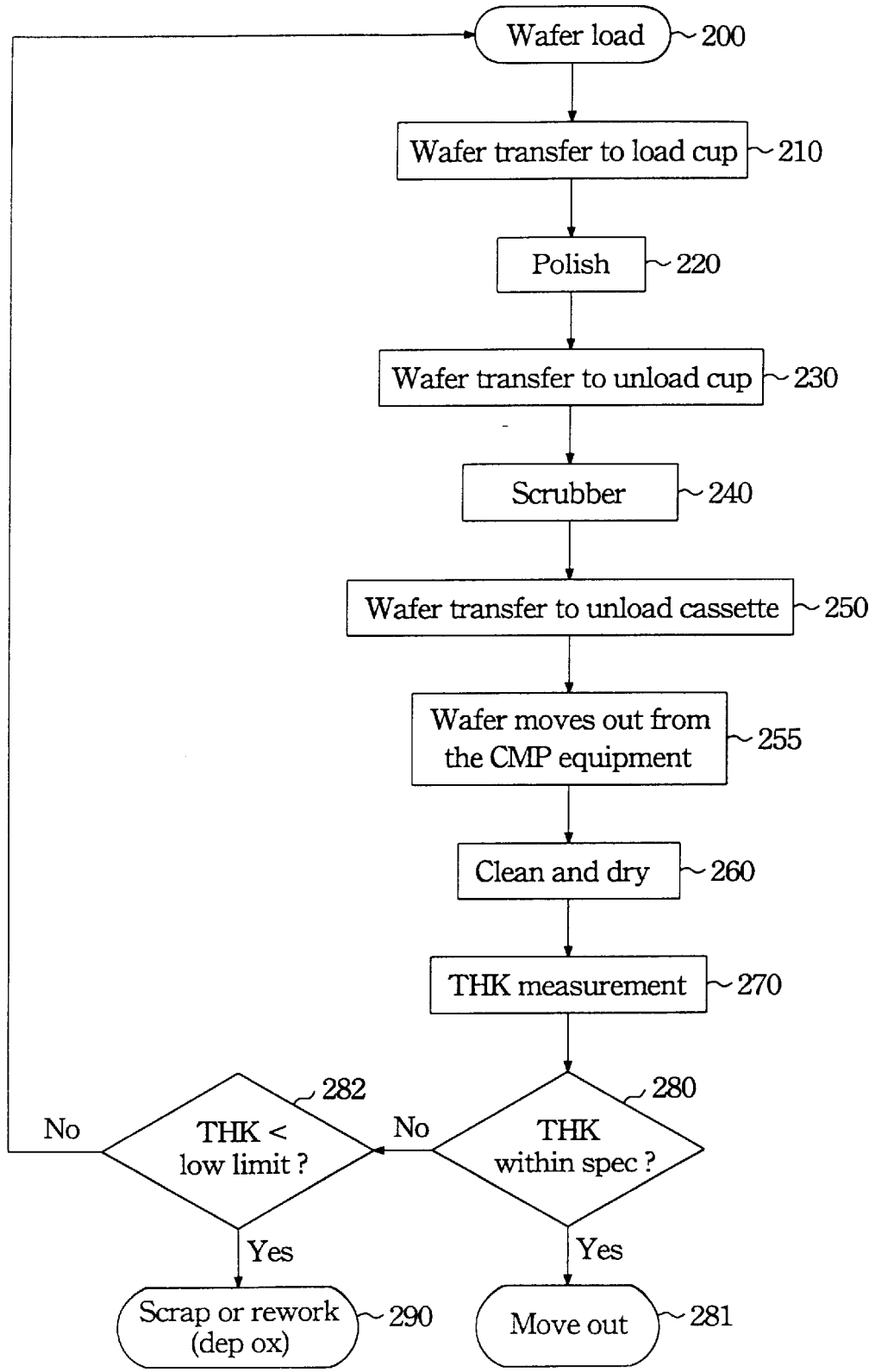
FIGS. 1 is a flow chart of a chemical mechanical polishing method to transfer wafers into a chemical mechanical polishing equipment during a CMP process in accordance with prior art.
Figure 2:
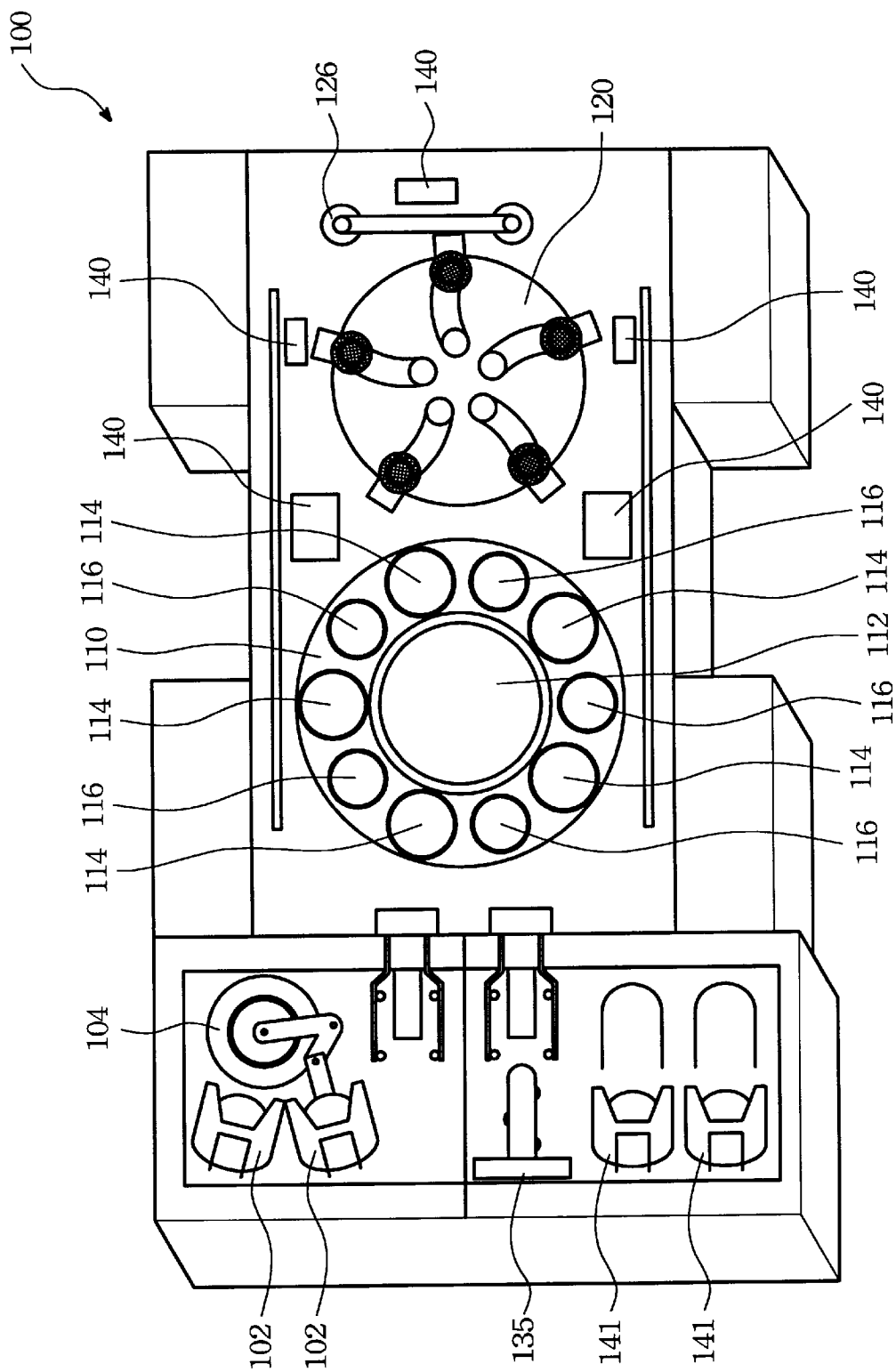
FIG. 2 is a top view of chemical mechanical polishing equipment in accordance with the present invention and it has several components used to perform polishing of wafers in the equipment.

Referring to FIG. 2, a top view of CMP equipment 100 is explained and a semiconductor wafer is polished in the CMP equipment. Several wafer cassettes 102 fix on one side of the CMP equipment 100 and semiconductor wafers are loaded upon the wafer cassettes 102 for transferring these wafers into the CMP equipment 100. Wafer cassettes 102 connect with the CMP equipment 100 and a robot arm 104 in the CMP equipment 100 catches the semiconductor wafer loading into the CMP equipment 100.

Referring to FIG. 2 again, the CMP equipment 100 includes an index table 110 and a main polishing table 120. The main polishing table 120 consists of a polishing table, on where the semiconductor wafer is polished. A central region of the index table 110 is a second polishing table 112 for an aftermost CMP process. There are five loading tables 114 and five unloading tables 116 arranged at the peripheral region of the index table 110. Furthermore, each loading table 114 intervenes between two unloading tables 116. The loading tables 114 and the unloading tables 116 serves as the preliminary positions of loading wafers into and unloading wafers from the CMP equipment 100, respectively.

Still referring to FIG. 2, a polishing pad conditioner 126 is equipped with the CMP equipment 100. After every CMP process, the conditioner 126 is acted to scrub the top surface of the main polishing table 120 on the object of activation. After the main polishing table 120 has been activated, the polishing rate of wafers on the table 120 is increased. An in-line thickness measurement apparatus 140 puts beside the main polishing table 120. The polishing step of wafers in the CMP equipment 100 could be interrupted and the thickness of the polished thin film layer on the wafers is then detected without the clearance of the wafers by using at least one in-line thickness measurement apparatus 140. The in-line thickness measurement technique enhances the efficiency of the CMP equipment 100. After the semiconductor wafer is unloaded, the scrubbing apparatus 135 removes slurry on the wafers and the cleaning process is then done. In FIG. 2, unload cassettes 141 are connected with the CMP equipment 100 for storing the wafers which have been finished the CMP process.

In FIGS. 2, there demonstrates the preferred embodiment of the CMP equipment. The CMP equipment according to the present invention is used for the CMP process of wafers with an in-line thickness measurement and the wafers do not move out of the CMP equipment during the thickness measurement. Besides, the cleaning and drying of the wafers is not necessary before the in-line thickness measurement.

Figure 3:
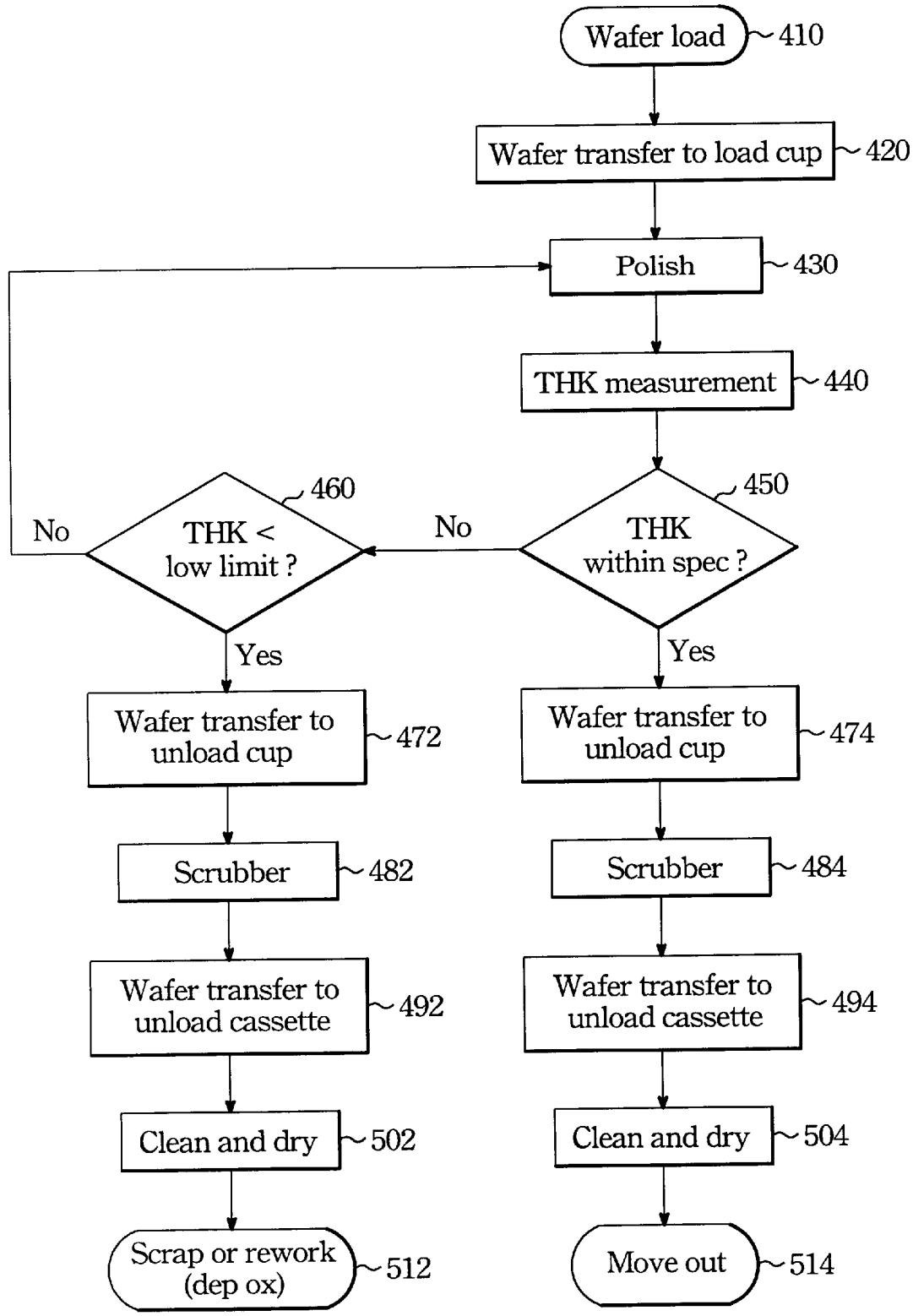
FIG. 3 is a flow chart of a chemical mechanical polishing method to show how to move wafers in a chemical mechanical polishing equipment in accordance with the present invention during a chemical-mechanical process.

Referring to FIG. 3, it explains the process flow of a CMP process in the CMP equipment with an in-line thickness measurement apparatus according to the present invention. First, in Step 410, semiconductor wafers are stored in wafer cassettes for loading into the CMP equipment. In Step 420, the semiconductor wafers are putted on the loading table for the preparation of the CMP process. In Step 430, the semiconductor wafers are putted on the polish pad and a polish head fixes the wafers to rotate the wafers on the polish pad. As the wafer is rotated on the polish pad, the wafer is polished by the polish pad. In Step 440, an in-line thickness measurement is performed on a polished thin film layer on the wafers by using an in-line thickness measurement apparatus. The in-line thickness measurement technique is indicated as an optical technique. Moreover, during the in-line thickness measurement, the wafers must not move out from the CMP equipment and a cleaning process of the wafers is not needed. In Step 450, the thickness of the polished thin film layer after the CMP process is determined whether or not being accepted by a specification of the CMP process. As the thickness of the polished thin film layer is accepted by the specification, Step 450 is followed by Step 474. As the thickness of the polished thin film layer is less than the low limit of the specification, Step 450 is followed by Step 460. In Step 474, the semiconductor wafers are transferred to unloading tables. In Step 484, the semiconductor wafers are cleaned to remove slurry on the wafers. In Step 494, the semiconductor wafers are transferred to unload wafer cassettes. In Step 504, the semiconductor wafers are cleaned and dried using a high-speed spinner to remove slurry on the semiconductor wafers. In Step 514, the semiconductor wafers are removed out from the CMP equipment. After the CMP process is done, as the thickness of the polished thin film layer is not accepted by the specification of the CMP process, Step 460 is performed to determine whether or not the thickness is less than the low limit of the specification. As the thickness of the polished thin film layer is less than the low limit of the specification, Step 430 is started to polish the semiconductor wafers. As the thickness of the polished thin film layer is larger than the low limit of the specification, Step 472 is started to transfer the semiconductor wafer to unload tables and the CMP process of the wafers is stopped. In Step 482, the surface of the semiconductor wafers is scrubbed to remove slurry. In Step 492, the semiconductor wafers are transferred to unload cassettes. In Step 502, clean and dry the semiconductor wafer, remove slurry on the surface of the semiconductor wafers. In Step 512, the semiconductor wafers are moved out from the CMP equipment and the CMP process is finished.

The thickness accuracy of the in-line thickness measurement apparatus is about 1.0%. The precision of the thickness, which is valued by the apparatus, is about 0.25%. The material, which can be detected by the apparatus, includes thermal oxide, TEOS, polysilicon, silicon nitride, sputtered oxide, titanium, titanium nitride, amorphous silicon, titanium silicon, aluminum, silicon and titanium silicon.

While the preferred embodiment of the invention has been illustrated and described, it will be appreciated that various changes can be made therein without departing from the spirit and scope of the invention.

What is claimed is:

1. A chemical mechanical polishing method with an in-line thickness measurement of a wafer in a chemical mechanical polishing equipment, comprising:

loading said wafer into said chemical mechanical polishing equipment;

performing a chemical mechanical polishing process on said wafers for polishing a film on said wafer;

performing an in-line thickness measurement of said film on said wafer, as said chemical mechanical polishing process interrupted;

determining whether said thickness is accepted by a specification or not, as said thickness is accepted by said specification, said chemical mechanical polishing process is stopped; and cleaning and drying said wafer after said wafer being moved out from said CMP equipment.

2. The method of claim 1, wherein said in-line thickness measurement is performed by using an optical technique, before said wafer is cleaned and dried.

3. The method of claim 1, wherein said step of determining when said thickness is smaller than a low limit of said specification, said wafer being moved out from said chemical mechanical polishing equipment and a deposition for said film is then performed.

4. The method of claim 1, wherein said step of determining when said thickness is larger than a high limit of said specification, a chemical mechanical polishing process is performed on said wafer.

5. The method of claim 1, wherein said specification has a high limit and a low limit, as said thickness of said film on said wafer is smaller than said high limit and larger than said low limit, said thickness is indicated as accepted by said specification.

6. A chemical mechanical polishing method with an in-line thickness measurement of a wafer in a chemical mechanical polishing equipment, comprising:

loading said wafer into said chemical mechanical polishing equipment;

performing a chemical mechanical polishing process on said wafers for polishing a film on said wafer;

performing an in-line thickness measurement of said film on said wafer by using an optical technique, as said chemical mechanical polishing process interrupted, to determine a thickness of said film on said wafer;

determining whether said thickness is accepted by a specification or not;

determining whether or not to continue said chemical mechanical polishing process, said chemical mechanical polishing process is stopped as said thickness is accepted by said specification, said chemical mechanical polishing process is continued as said thickness is larger than said specification until said thickness is accepted by said specification; and performing cleaning and drying process on said wafer after said wafer being moved out from said CMP equipment.

7. The method of claim 6, wherein said in-line thickness measurement of said wafer is performed by using an optical technique before said wafer is cleaned and dried.

8. The method of claim 6, wherein said step of determining when said thickness of said film is larger than a high limit of said specification, a chemical mechanical polishing process is performed on said wafer.

9. The method of claim 1, wherein said specification has a high limit and a low limit, said thickness of said film is indicated as accepted by said specification as said thickness of said film is smaller than said high limit and larger than said low limit.

10. A chemical mechanical polishing method with an in-line thickness measurement of a wafer in a chemical mechanical polishing equipment, comprising:

loading said wafer into said chemical mechanical polishing equipment;

performing a chemical mechanical polishing process on said wafers for polishing a film on said wafer;

performing an in-line thickness measurement of said film on said wafer, wherein said chemical mechanical polishing process is interrupted and an optical technique is used for measuring a thickness of said film;

determining whether said thickness is accepted by a specification or not;

determining whether or not to continue said chemical mechanical polishing process, said chemical mechanical polishing process is stopped as said thickness is accepted by said specification, said chemical mechanical polishing process is continued as said thickness is larger than said specification until said thickness is accepted by said specification;

determining whether or not stopping said chemical mechanical polishing process, a deposition of said film is performed and said chemical mechanical polishing process is stopped until said thickness of said film is smaller than said specification; and performing cleaning and drying process on said wafer after said chemical mechanical polishing is stopped and said wafer is moved out from said CMP equipment.

11. The method of claim 10, wherein said in-line thickness measurement of said wafer is performed by using an optical technique before said wafer is cleaned and dried.

12. The method of claim 10, wherein said step of determining when said thickness of said film is larger than a high limit of said specification, said wafer is loaded into said chemical mechanical polishing equipment and said chemical mechanical polishing process is performed on said wafer again.

13. The method of claim 10, wherein said specification has a high limit and a low limit, said thickness is indicated as being accepted by said specification as said thickness is smaller than said high limit and larger than said low limit.

14. The method of claim 10, wherein said thickness of said film smaller than said specification means that said thickness is smaller than a low limit of said specification.

15. A chemical mechanical polishing apparatus for in-line measuring a thickness of a film on a wafer, comprising:

wafer loading cassettes connecting to said chemical mechanical polishing apparatus for loading wafer into said chemical mechanical polishing apparatus;

a robot arm to catch said wafer;

a wafer aligner, said robot arm catches said wafers from said loading cassettes and puts said wafers on said wafer aligner to adjust orientation of said wafers;

an index table positioned in said chemical mechanical polishing apparatus, said wafer aligner moving said wafers to said index table before a chemical mechanical polishing process is performed on said wafer;

a polishing pad positioned in said chemical mechanical polishing apparatus, wherein said wafers are polished on said polishing pad;

an in-line thickness measurement apparatus positioned beyond said polishing pad, said wafer being detected by using said in-line thickness measurement apparatus to measure a thickness of a film on said wafers during said chemical mechanical polishing process;

a scrubber for scrubbing said wafer after said chemical mechanical polishing process; and wafer unload cassettes connecting to said chemical mechanical polishing apparatus for unloading said wafers from said chemical-mechanical apparatus after said wafers have been cleaned and dried.

16. The apparatus of claim 15, wherein said in-line thickness measurement apparatus detects said film on said wafer by using optical technique to determine said thickness of said film as said chemical mechanical polishing process of said wafers is interrupted.

* * * * *